(12) United States Patent
Nagashima et al.

(10) Patent No.: US 6,697,407 B2
(45) Date of Patent: Feb. 24, 2004

(54) SEMICONDUCTOR LASER ATTAINING HIGH EFFICIENCY AND HIGH POWER, AND METHOD OF MANUFACTURING THE SAME

(75) Inventors: Yasuaki Nagashima, Atsugi (JP); Katsunori Shinone, Atsugi (JP); Tomoyuki Kikugawa, Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 10/061,647

(22) Filed: Feb. 1, 2002

(65) Prior Publication Data

US 2002/0118717 A1 Aug. 29, 2002

(30) Foreign Application Priority Data

Feb. 28, 2001 (JP) .................................... 2001-055109

(51) Int. Cl.[7] ................................................. H01S 5/00
(52) U.S. Cl. ........................... 372/46; 372/43; 372/44; 372/45
(58) Field of Search ................................ 372/46, 43–45

(56) References Cited

U.S. PATENT DOCUMENTS

| | | | |
|---|---|---|---|
| 5,452,315 A | | 9/1995 | Kimura et al. |
| 5,470,785 A | | 11/1995 | Kondo |
| 5,568,501 A | * | 10/1996 | Otsuka et al. ................. 372/46 |
| 5,585,309 A | * | 12/1996 | Mori et al. .................... 437/129 |
| 6,110,756 A | * | 8/2000 | Otsuka et al. ................. 438/41 |
| 6,333,946 B1 | * | 12/2001 | Miyashita et al. ............ 372/46 |
| 2003/0012240 A1 | * | 1/2003 | Yamamoto et al. ........... 372/46 |

FOREIGN PATENT DOCUMENTS

| | | |
|---|---|---|
| EP | 0 420 143 | 5/1992 |
| JP | 7-022691 A | 1/1995 |

* cited by examiner

*Primary Examiner*—Paul Ip
*Assistant Examiner*—Leith A Al Nazer
(74) *Attorney, Agent, or Firm*—Frishauf, Holtz, Goodman & Chick, P.C.

(57) ABSTRACT

An n-type semiconductor substrate has a (100) crystal plane as an upper surface. A mesa stripe portion has a trapezoidal shape including an n-type first clad layer, an active layer and a p-type second clad layer sequentially stacked on the substrate and formed along a <011> direction. A current block portion has a p-type current blocking layer and an n-type current blocking layer. A p-type third clad layer simultaneously covers both the upper surfaces of the mesa stripe portion and the current blocking portion. The inclination angle as being acute angle of the side surface of the mesa stripe portion is close to the inclination angle of a (111)B crystal plane with respect to the (100) crystal plane and set at one of an angle larger than and an angle smaller than the inclination angle of the (111)B crystal plane.

7 Claims, 5 Drawing Sheets

FIG. 6 PRIOR ART

SEMICONDUCTOR LASER ATTAINING HIGH EFFICIENCY AND HIGH POWER, AND METHOD OF MANUFACTURING THE SAME

CROSS-REFERENCE TO RELATED APPLICATIONS

The application is based upon and claims the benefit of priority from the prior Japanese Patent Application No. 2001-055109 filed Feb. 28, 2001, the entire contents of which are incorporated herein by reference.

BACKGROUND OF THE INVENTION

1. Field of the Invention

The present invention relates a semiconductor laser and a method of manufacturing the semiconductor laser. Particularly, the present invention relates to a semiconductor laser and a method of manufacturing the semiconductor laser which is capable of attaining a high power laser light emission with high efficiency by reducing a reactive current which does not contribute to laser oscillation.

2. Description of the Related Art

Recently, with the progress of optical communications systems, long-distance communications by means of optical communications cables has been realized.

The semiconductor laser to be employed as a light source of the optical communications systems must have characteristics of high efficiency and high power.

Figure 5:
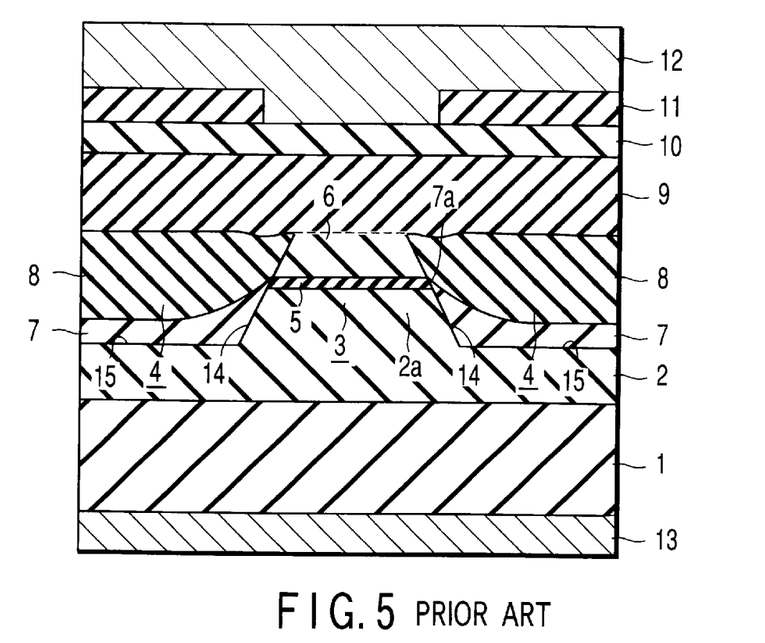
FIG. 5 is a schematic sectional view of a structure of a conventional semiconductor laser.

FIG. 5 shows a sectional structure of a generally used buried-type semiconductor laser capable of obtaining a high efficiency laser light. The semiconductor laser of this type is conventionally known and disclosed in Jpn. Pat. Appln. No. 7-22691.

Specifically as shown in FIG. 5, in the semiconductor laser, a first clad layer 2 of a p-type InP is formed on a p-type InP substrate 1 having a (100) crystal plane or a crystal plane close to the (100) crystal plane as the upper surface.

On the upper center of the first clad layer 2, a mesa stripe portion 3 having a trapezoidal shape is formed.

Furthermore, outside the mesa stripe portion 3 on the first clad layer 2, a current blocking portion 4 is formed.

The mesa stripe portion 3 is formed of a projecting portion 2a of the first clad layer 2, an active layer 5 of non-doped InGaAsP formed on the projecting portion 2a of the first clad layer 2, and a second clad layer 6 of n-type InP formed on the active layer 5.

The current blocking portion 4 at both sides of the mesa stripe portion 3 is formed of an n-type current blocking layer 7 of n-type InP for blocking migration of holes present at the lower side, and a high resistance semiconductor layer 8 doped with Fe, for blocking migration of electrons present at the upper side.

A third clad layer 9 of n-type InP is formed so as to simultaneously cover the upper surface of the mesa stripe portion 3 and the upper surface of the current blocking portion 4.

On the third clad layer 9, a contact layer 10 is formed.

On the upper surface of the contact layer 10, an insulating layer 11 is formed so as to face the current blocking portion 4.

An electrode plate 12 is attached to the portion of the upper surface of the contact layer 10 facing to the mesa stripe portion 3.

Furthermore, an electrode plate 13 is attached also on the lower surface of the P-type InP substrate 1.

In the semiconductor laser thus constructed, when a direct-current driving voltage is applied across the upper and lower electrode plates 12 and 13, the current is restricted by the current blocking portion 4 due to the presence of the n-type current blocking layer 7 and the high-resistance semiconductor layer 8.

As a result, the current is concentrated on the mesa-stripe portion 3 at the center, increasing the efficiency of laser light emitting from the active layer 5 of the mesa stripe portion 3.

Furthermore, in the semiconductor laser, it is necessary to minimize a reactive current (leakage current) flowing not through the active layer 5 of the mesa stripe portion 3 but from the second clad layer 6 to the n-type current blocking layer 7.

To avoid direct contact between the first clad layer 2 (2a) formed of p-type InP and the high-resistance semiconductor layer 8, a top-end 7a of the n-type current blocking layer 7 is positioned on the border between the active layer 5 and the second clad layer 6.

To form such a structure, etching is performed in its manufacturing process of the semiconductor laser in the conditions under which a (111)B crystal plane can be exposed on an inclined side surface 14 of the mesa stripe portion 3 having a trapezoidal shape.

Furthermore, a (100) crystal plane is exposed by etching on the upper surface 15 of the first clad layer 2 outside the mesa stripe portion 3.

Thereafter, the n-type current blocking layer 7 is grown on the inclined side surface 14 of the mesa stripe portion 3 and on the upper surface 15 of the first clad layer 2 by use of a metal-organic-vapor-phase epitaxy (MOVPE) method.

As known well, the n-type current blocking layer 7 is grown directly on the (100) crystal plane but not grown directly on the (111)B crystal plane.

Figure 6:
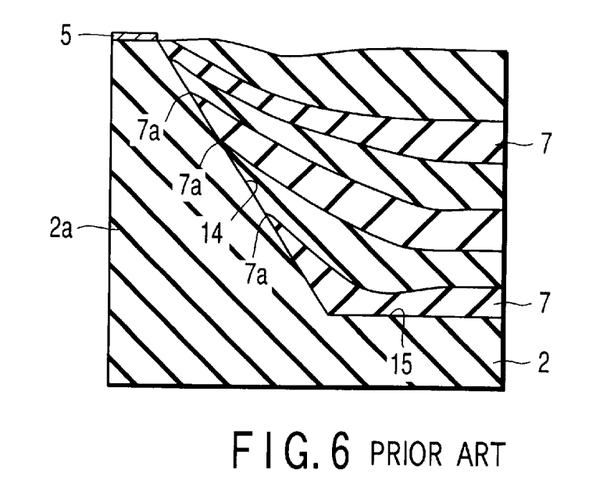
FIG. 6 is an illustration for explaining characteristics of the conventional semiconductor laser.

Accordingly, in the case where the n-type current blocking layer 7 is grown by use of the metal-organic-vapor-phase epitaxy (MOVPE) method, a tapered tip 7a of the n-type current blocking layer 7 creeps up along the inclined side surface 14 of the mesa stripe portion 3 in accordance with the growth of the n-type current blocking layer 7, as shown in FIG. 6.

Accordingly, when the tapered tip 7a of the n-type current blocking layer 7 reaches the border between the active layer 5 and the second clad layer 6, the growth operation of the n-type current blocking layer 7 by use of the metal-organic-vapor-phase epitaxy (MOVPE) method is terminated The manufacturing method mentioned above makes it possible to minimize the reactive current (leakage current) flowing from the second clad layer 6 to the n-type current blocking layer 7 without passing through the active layer 5 of the mesa stripe portion 3.

Furthermore, by employing the Fe-doped high resistant semiconductor layer 8 as the current blocking portion 4, a high-speed operation can be attained.

However, the conventional semiconductor laser having the structure shown in FIG. 5 still have the following problems to be solved.

In the case where the n-type current blocking layer 7 is grown by the metal-organic-vapor-phase epitaxy (MOVPE) method as shown in FIG. 6, the tapered tip 7a of the n-type current blocking layer 7 creeps up along the inclined side surface 14 of the mesa stripe portion 3 as it grows.

Thereafter, when the tapered tip 7a reaches the border between the active layer 5 and the second clad layer 6, it is necessary to terminate the growth operation using the metal-organic-vapor-phase epitaxy (MOVPE) method.

However, the timing (time) at which the tapered tip 7a reaches the border between the active layer 5 and the second clad layer 6 varies depending upon voltage application conditions of the metal-organic-vapor-phase epitaxy (MOVPE) method and the height of the trapezoidal mesa stripe portion 3 which slightly varies depending upon etching conditions.

Therefore, the tapered tip 7a of the n-type current blocking layer 7 fails to reach the border between the active layer 5 and the second clad layer 6 in some cases, and in other cases, it reaches up to the middle of the side surface of the second clad layer 6.

As a result, the first clad layer 2 (2a) of p-type InP may be brought into direct contact with the high resistance semiconductor layer 8. Alternatively, the amount of the reactive current (leakage current) flowing from the second clad layer 6 to the n-type current blocking layer 7 may increase, with the result that stable and high efficient laser-emitting characteristics as the semiconductor laser cannot be obtained.

Furthermore, in the conventional semiconductor laser mentioned above, a p-type InP substrate is employed.

The p-type InP substrate, as is known well, has a high specific resistance compared to an n-type InP substrate.

As a result, if the amount of a current to be supplied to the semiconductor laser is increased in order to obtain a high-power laser, the generation of heat increases.

Therefore, the semiconductor laser employing the p-type InP substrate is useful in the cases where a switching operation is carried out at a high speed, however is not suitable as a semiconductor laser like a light source for an optical communications system.

An impurity, Zn, diffuses within the p-type semiconductor more easily than within the n-type semiconductor. Therefore, when Zn is doped into a p-type InP substrate as an impurity, the diffusion of Zn is easily performed. It follows that Zn diffuses up to the area in the proximity of the active layer of the p-type InP first clad layer.

Consequently, the laser generation efficiency at the active layer is reduced and thus high power laser light emission cannot be obtained.

As described above, in the semiconductor laser employing the p-type InP substrate, stable and high power laser emission characteristics cannot be obtained.

As disclosed in Jpn. Pat. Appln. No. 7-162078, a semiconductor laser employing an n-type InP substrate in place of a p-type InP substrate is also proposed.

However, in this publication (Jpn. Pat. Appln. No. 7-162078) disclosing a semiconductor laser employing an n-type InP substrate, no mention is made of a structure of the contact portion between the side surface of the mesa stripe portion and the current blocking portion (in contact with the side surface), at all.

In short, as described above, since the amount of the reactive current (leakage current) not flowing through the active layer increases, stable and high efficiency laser emission characteristics as a semiconductor laser cannot be obtained.

BRIEF SUMMARY OF THE INVENTION

The present invention is made in view of the aforementioned circumstances and an object of the present invention is to provide a semiconductor laser and a method of manufacturing the semiconductor laser which is formed by using an n-type semiconductor substrate and setting the inclination angle of the side surface of the mesa strip portion such that a (111)B crystal plane is not directly exposed in the inclined surface of the mesa stripe portion having a trapezoidal shape so as to control a reactive current not flowing through an active layer of the mesa stripe portion to fall within a predetermined range and to maintain a high withstand voltage at the current blocking portion, thereby attaining a high efficiency and high power laser light emission characteristics.

To attain the aforementioned object, according to a first aspect of the present invention, there is provided a semiconductor laser comprising:

an n-type semiconductor substrate having a (100) crystal plane as an upper surface;

a mesa stripe portion having a trapezoidal shape and formed along a <011> direction, the mesa stripe portion including an n-type first clad layer, an active layer, and a p-type second clad layer, which are successively formed on the n-type semiconductor substrate;

a current blocking portion formed of a p-type current blocking layer formed outside the mesa stripe portion and on the n-type semiconductor substrate, and an n-type current blocking layer is formed on the p-type current blocking layer; and a p-type third clad layer simultaneously covering both the upper surface of the mesa stripe portion and the upper surface of the current blocking portion, in which an inclination angle being an acute angle of a side surface of the mesa stripe portion having a trapezoidal shape and formed along a <011> direction is close to an inclination angle of a (111)B crystal plane with respect to the (100) crystal plane and set at one of an angle larger than and an angle smaller than the inclination angle of the (111)B crystal angle.

According to a second aspect of the present invention, there is provided the semiconductor laser according to the first aspect in which a thickness of the p-type current blocking layer in a direction perpendicular to an inclined side surface of the mesa stripe portion near the active layer is set to be thinner than a thickness in a direction perpendicular to the (100) crystal plane of the n-type semiconductor substrate; and an impurity concentration of the p-type current blocking layer near the active layer of the mesa stripe portion is set to be lower than an impurity concentration of the p-type current blocking layer near the (100) crystal plane of the n-type semiconductor substrate.

According to a third aspect of the present invention, there is provided the semiconductor laser according to the second aspect, in which the n-type semiconductor substrate is formed of n-type InP; and the p-type current blocking layer is formed of p-type InP containing an impurity of Zn or Cd.

According to a fourth aspect of the present invention, there is provided the semiconductor laser according to any one of the first to third aspects, in which inclination of the side surface of the mesa stripe portion is set at an angle within (+1° to +5°) or (−1° to −5°) to the inclination angle of the (111)B crystal plane.

According to a fifth aspect of the present invention, there is provided a semiconductor laser according to any one of the first to fourth aspects, in which an upper end of the side surface of the mesa stripe portion is positioned higher than a vicinity of the active layer.

To attain the aforementioned object, according to a sixth aspect of the present invention, there is provided a method of manufacturing a semiconductor laser comprising:

preparing an n-type semiconductor substrate having a (100) crystal plane as an upper surface;

stacking an n-type first clad layer, an active layer, and a p-type second clad layer sequentially on the n-type semiconductor substrate, and, forming a mesa stripe portion having a trapezoidal shape along a <011> direction, the mesa stripe portion including the n-type first clad layer, the active layer, and a p-type second clad layer;

forming an p-type current blocking layer outside the mesa stripe portion and on the n-type semiconductor substrate and an n-type current blocking layer on the p-type current blocking layer, as the current blocking portion using a metal organic vapor phase epitaxy (MOVPE) method; and covering both an upper surface of the mesa stripe portion and an upper surface of the current blocking portion with a p-type third clad layer, in which an inclination angle being an acute angle of the side surface of the mesa stripe portion having a trapezoidal shape and formed along the <011> direction is close to an inclination angle of a (111)B crystal plane with respect to the (100) crystal plane and set at one of an angle larger than and an angle smaller than an inclination angle of the (111)B crystal plane.

According to a seventh aspect of the present invention, there is provided a method of manufacturing a semiconductor laser according to a sixth aspect, in which the mesa stripe portion is formed by forming a mask on an upper surface of the second clad layer and etching the n-type first clad layer, the active layer, and the p-type second clad layer into a trapezoidal shape;

the current blocking portion is formed by growing the p-type current blocking layer and the n-type current blocking layer on the side surface of the mesa stripe portion and on the upper surface of the n-type semiconductor substrate exposed by etching;

the p-type third clad layer is formed so as to simultaneously cover both the upper surface of the mesa stripe portion from which the mask is removed and the upper surface of the current blocking portion;

forming the mesa stripe portion comprises interposing a cap layer between the second clad layer and the mask;

setting conditions of etching such that inclination of the side surface of the mesa stripe portion to be obtained by side etching of the cap layer has an angle near a predetermined angle at which the (111)B crystal plane is exposed, excluding the predetermined angle; and removing the mask simultaneously with the cap layer.

According to an eighth aspect of the present invention, there is provided the method of manufacturing a semiconductor laser according to the sixth aspect, in which the n-type semiconductor substrate is InP doped with an n-type impurity, the first clad layer is InP doped with an n-type impurity, the active layer has a multiple quantum well structure consisting of non-doped InGaAs, non-doped InGaAsP, or a combination thereof, the second clad layer is InP doped with a p-type impurity, the cap layer is InGaAsP, and the p-type current blocking layer is p-type InP doped with an impurity of Zn or Cd.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Reference will now be made in detail to the presently preferred embodiments of the invention as illustrated in the accompanying drawings, in which like reference numerals designate like or corresponding parts.

In the first place, the outlines of the present invention will be explained.

The present invention is applied to a semiconductor laser comprising an n-type semiconductor substrate; a mesa stripe portion having a trapezoidal shape, formed on the n-type semiconductor substrate, including an n-type first clad layer, an active layer, and a p-type second clad layer, and formed along a <011> direction; a current blocking portion formed of a p-type current blocking layer formed on the n-type semiconductor substrate and outside the mesa stripe portion and an n-type current blocking layer formed on the p-type current blocking layer; and a p-type third clad layer simultaneously covering the upper surface of the mesa stripe portion and the upper surface of the current blocking portion.

In the semiconductor laser of the present invention, the n-type InP substrate has a (100) crystal plane as the upper surface.

The inclination of the side surface of the mesa stripe portion having a trapezoidal shape and formed along the <011> direction is set at an angle in the proximity of the specific angle at which a (111)B crystal plane is exposed but not set at the specific angle.

Figure 2:
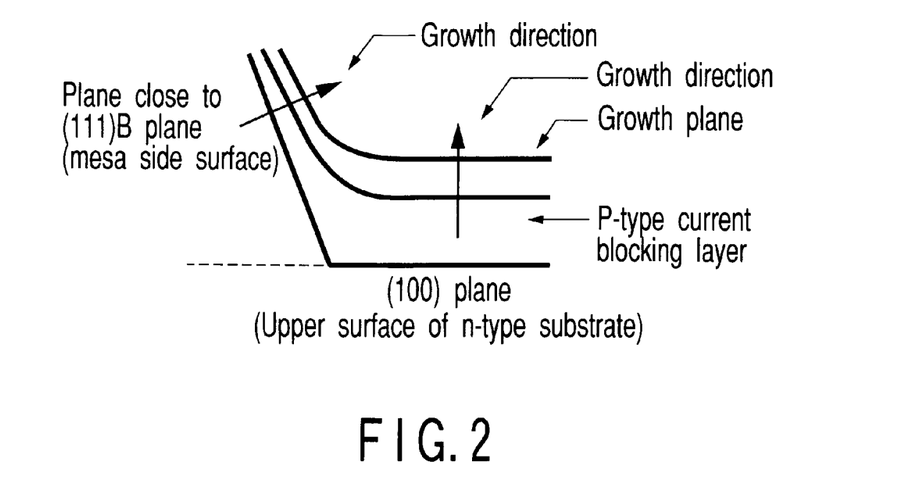
FIG. 2 is an illustration for explaining the effect of the semiconductor laser of the present invention.

In the semiconductor laser thus constructed, more specifically, in the state before the current blocking portion is formed, as shown in FIG. 2, the (111)B crystal plane is not exposed directly from the mesa stripe portion etched along the <011> direction into a trapezoidal shape. Instead, a plane inclined at an angle near the inclination angle of the (111)B crystal plane is exposed.

On the other hand, outside the mesa stripe portion etched into a trapezoidal shape, the (100) crystal plane of the n-type semiconductor substrate is exposed.

In the MOVPE method, on the (100) crystal plane, the p-type current blocking layer forming the current block portion is grown at a predetermined rate which is determined by formation conditions such as time.

On the other hand, in the plane inclined at an angle near the inclination angle of the (111)B crystal plane, the p-type current block layer is slightly grown. More specifically, the p-type current block layer grows at a slow rate which differs depending upon how the angle of the p-type current block layer differs from the inclination angle of the (111)B crystal plane.

Accordingly, the p-type current blocking layer is grown almost uniformly over the side surface of the mesa stripe portion from the beginning of the growth.

Therefore, the reactive current flowing from the p-type second clad layer to the p-type current blocking layer can be minimized to a constant value without fail.

Furthermore, in a semiconductor laser according to another aspect of the invention, the thickness of the p-type current blocking layer near the active layer in direction perpendicular to the inclined side surface of the mesa stripe portion is set to be thinner than the thickness in the direction perpendicular to the (100) crystal plane of the n-type semiconductor substrate.

The impurity concentration of the p-type current blocking layer near the active layer, that is, near the mesa stripe portion is set to be lower than that near the (100) crystal plane of the n-type semiconductor substrate.

As previously described, the growth rate of the p-type current blocking layer near the (111)B crystal plane is considerably small to that near the (100) crystal plane.

Even if the same amount of an impurity is doped into the p-type current blocking layer, the amount of the impurity left inside, namely, an impurity concentration, differs depending upon the relationship between the doping direction and the crystal plane.

More specifically, the concentration with respect to the direction of the (100) crystal plane of the n-type semiconductor substrate is larger than that with respect to the direction of the plane in the proximity of the (111)B crystal plane of the mesa stripe portion.

Figure 3A:
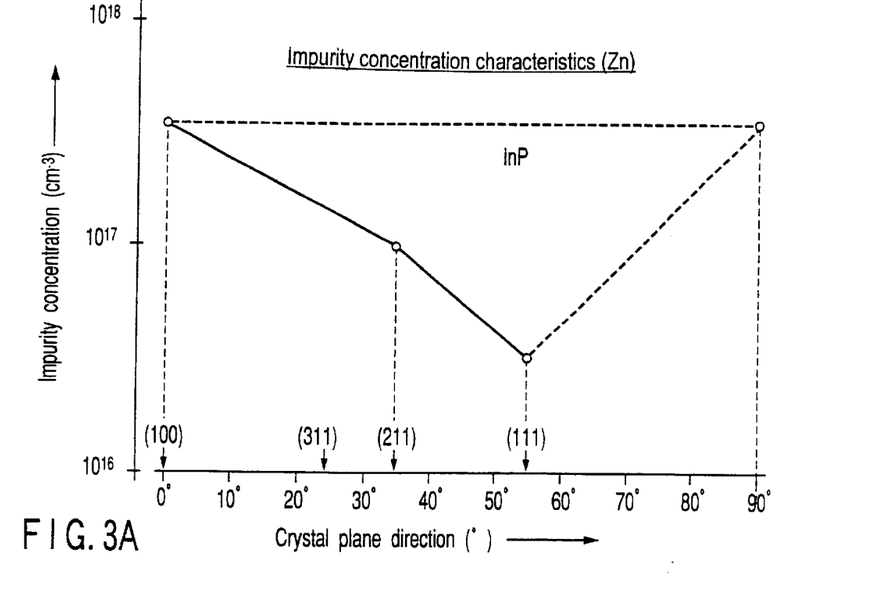
FIG. 3A is a characteristic graph of impurity concentration showing the relationship between the direction of a crystal plane to be doped with an impurity and the impurity concentration.

FIG. 3A shows a characteristic graph of impurity concentration experimentally obtained. More specifically, FIG. 3A shows the relationship between the direction of the crystal plane (crystal-plane angle) and the impurity concentration when Zn is doped as an impurity into InP at a constant doping rate while gradually changing the direction (angle) of the crystal plane to be doped.

In FIG. 3A, in the direction of the crystal plane (horizontal axis), a change amount in direction of each crystal plane from the (100) crystal plane is indicated in terms of an angle (°) based on the (100) crystal plane as being 0°.

As is apparent from the characteristic graph of FIG. 3A, the concentration with respect to the direction of the (100) crystal plane is larger about ten times than that with respect to the direction of the (111) crystal plane.

The fact that the impurity concentration of the p-type current blocking portion near the mesa stripe portion is low means that the electronic resistance of the p-type current blocking portion near the mesa stripe portion is high. The reactive current flowing through the p-type current blocking portion near the mesa stripe portion can be further reduced.

If the impurity concentration of the p-type current blocking layer near the (100) crystalline plane of the n-type semiconductor substrate is high, it becomes difficult to turn on (become conductive) a thyristor of a p-n-p-n structure formed of the p-type third clad layer, n-type current blocking layer, p-type current blocking layer, and n-type semiconductor substrate. It follows that a high voltage can be applied by the semiconductor laser, stabilizing the characteristics of the semiconductor laser.

As described above, it is possible to simultaneously improve the critical characteristics contributing to attaining a high efficiency semiconductor laser.

Still another invention provides the semiconductor laser mentioned above in which the n-type semiconductor substrate is formed of n-type InP and the p-type current blocking layer is formed of a p-type InP doped with Zn or Cd as an impurity.

As previously described, the resistance of the n-type InP substrate can be reduced compared to the p-type InP substrate. Therefore, the use of the n-type InP substrate makes it possible to generate heat in a reduced amount even if a large amount of current is supplied to the semiconductor laser. For the reason, high-power laser light can be obtained simply by increasing the amount of current.

Furthermore, in the case of the p-type InP substrate, the impurity within the p-type InP substrate diffuses toward the active layer in the course of the growth from the first clad layer→the active layer→the second clad layer→the blocking layer→the third clad layer. As a result, light-loss increases and thus laser emission decreases in efficiency and output power. However, the n-type InP substrate is free from such a disadvantage.

In a further invention, the inclination of the side wall of the mesa stripe portion (hereinafter sometimes referred as "mesa angle") in the semiconductor laser of the invention mentioned above is set at an angle within (+1° to +5°) or (−1° to −5°) to the specific angle at which the (111)B crystal plane is exposed.

Figure 3B:
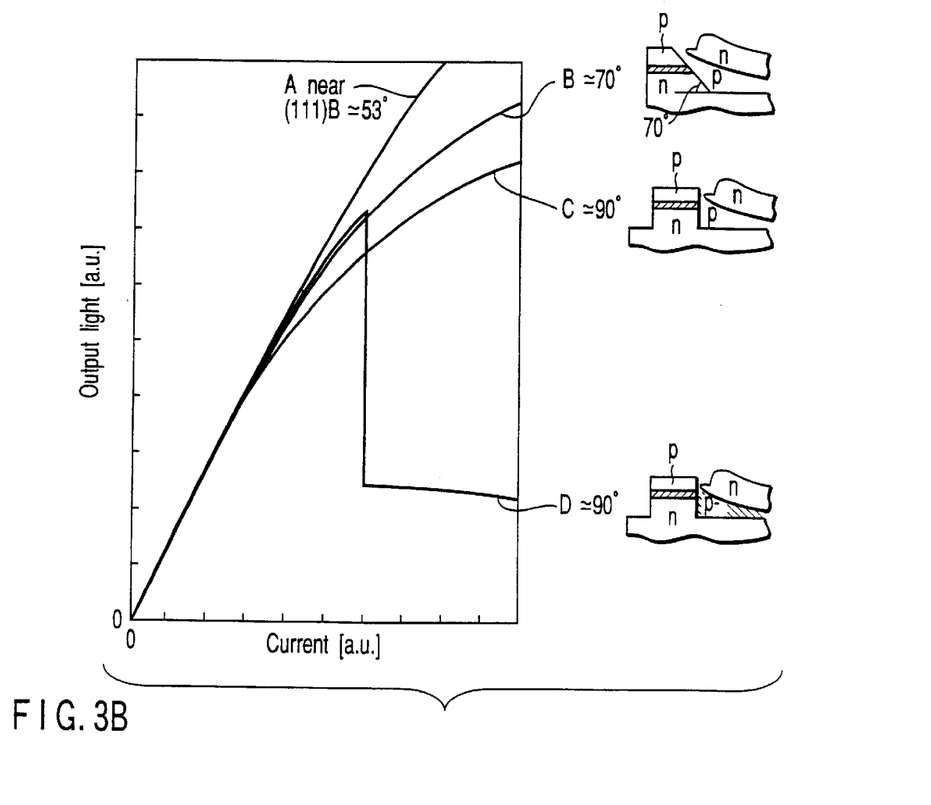
FIG. 3B is a characteristic graph showing current versus light emission for semiconductor layers different in mesa angle and in impurity concentration of the p-type blocking layer.

FIG. 3B is a characteristic graph showing current versus light emission for semiconductor layers different in mesa angle and in impurity concentration of the p-type blocking layer.

A to C curves show characteristic changes when only mesa angle changes while a doping amount to the p-type blocking layer is maintained constant. As the mesa angle gradually increases from the angle in the proximity of the (111)B plane, the concentration of the impurity of the mesa side surface increases. Since the electric resistance thus decreases, the amount of the reactive current, which flows from the p-type second clad layer to the n-type semiconductor substrate through the p-type current blocking layer, increases. As is clear from the figure that the light emission is saturated earlier as the mesa angle increases.

On the other hand, when C and D curves are compared, characteristics are found in the cases where the doping amount to the p-type current blocking layer differs although the mesa angle is the same. In the case of D, the impurity concentration of the p-type current blocking layer is set to be lower than that of the case of C by a factor of about 10.

In this case of D, the electric resistance of the mesa side surface is high and the reactive current is low. Therefore, the saturation characteristic is improved in the middle. However, since the impurity concentration of the p-type current blocking layer on the (100) crystal surface is uniformly reduced, the thyristor of a p-n-p-n structure formed of the p-type third clad layer, n-type current blocking layer, p-type current blocking layer, and n-type semiconductor substrate is turned on at a low current.

Another invention is applied to a method of manufacturing a semiconductor laser, comprising: growing an n-type first clad layer, an active layer, and a p-type second clad layer sequentially on an n-type semiconductor substrate having a (100) crystal plane as the upper surface; forming a mask over the upper surface of the second clad layer thus grown and etching the structure including the n-type first clad layer, the active layer, and the p-type second clad layer into a trapezoidal shape, thereby forming a mesa stripe portion; growing a p-type current blocking layer and an n-type current blocking layer sequentially on sides of the mesa stripe portion thus formed and on the exposed upper surface of the n-type semiconductor substrate, thereby forming a current blocking portion; and removing the mask, and forming a p-type third clad layer which simultaneously covers the upper surface of the mesa stripe portion from which the mask is removed and the upper surface of the current blocking portion.

In the method of manufacturing a semiconductor laser of the present invention, a cap layer is formed between the second clad layer and the mask.

Furthermore, in the step of forming the mesa stripe portion, the conditions of side-etching of the cap layer are set such that the inclination angle of a side surface of the mesa stripe portion falls within the proximity of a specific angle at which the (111)B crystal plane is exposed, excluding the specific angle.

Thereafter, the block layer is formed using a metal-organic-vapor-phase epitaxy method.

The cap layer is removed simultaneously with the mask.

As described, the cap layer is interposed between the p-type second clad layer and the mask, and the side surfaces of the mesa stripe portion are made closer to the (111)B crystal plane by setting the etching conditions appropriately.

Therefore, it is possible to form a p-type block layer having the aforementioned two excellent characteristics on side surfaces of the mesa stripe portion and the n-type semiconductor substrate.

Furthermore, another invention is the method of manufacturing a semiconductor laser according to the invention mentioned above, in which the n-type semiconductor substrate is InP doped with an n-type impurity, the first clad layer is InP doped with an n-type impurity, the active layer has a multiple quantum well structure formed of non-doped InGaAs, non-doped InGaAsP, or a combination thereof, the second clad layer is InP doped with a p-type impurity, and the cap layer is InGaAsP. Furthermore, the p-type current blocking layer is formed of a p-type InP doped with an impurity, Zn or Cd. Also, an n-type current blocking layer is formed of a InP doped with an n-type impurity.

Now, an embodiment of the preset invention is based on the aforementioned outline and will be explained with reference to the companying drawings.

Figure 1:
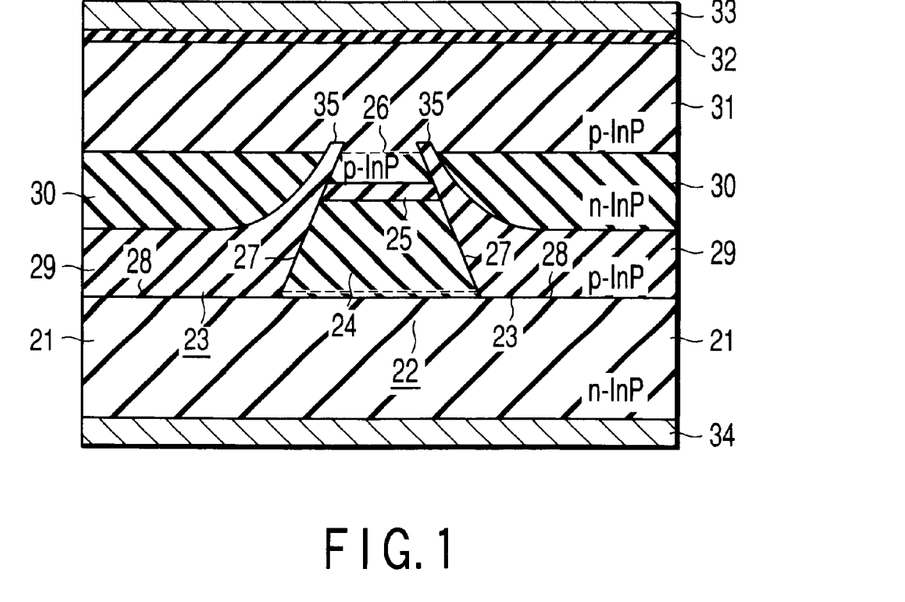
FIG. 1 is a schematic sectional view showing a structure of a semiconductor laser according to an embodiment of the present invention.

FIG. 1 is a schematic sectional view showing a structure of a semiconductor laser according to an embodiment of the present invention.

In the semiconductor laser, a mesa stripe portion 22 having a trapezoidal shape is formed at the center of the upper surface of an n-type InP substrate 21 formed of a semiconductor material, doped with an n-type impurity and having a (100) crystal plane as the upper surface.

Furthermore, a current blocking portion 23 is formed outside the mesa stripe portion 22 formed on the n-type InP substrate 21.

In the mesa stripe portion 22, an n-type first clad layer 24 of 0.5 μm thick containing an n-type impurity in a concentration of $1.0 \times 10^{18}$ cm$^{-3}$ is formed in contact with the n-type InP substrate 21.

On the n-type first clad layer 24, an active layer 25 of 0.2 μm thick is formed of a multi quantum well structure consisting of non-doped InGaAs, non-doped InGaAsP, or a combination thereof.

On the active layer 25, a p-type second clad layer 26 of 0.45 μm thick is formed which contains a p-type impurity in a concentration of $5–7 \times 10^{17}$ cm$^{-3}$.

The inclination angle of a side surface 27 in contact with the current blocking portion 23 of the mesa stripe portion 22 is set at 54.7° (θ)±1° to 5° (minor angle Δθ) where 54.7° is an angle at which the (111)B crystal plane is exposed.

In this embodiment, the minor angle of Δθ is set at ±1° to 5°.

In the upper surface of the n-type InP substrate 21, that is, the upper surface 28, in contact with the current blocking portion 23, a (100) crystal plane is exposed.

The current blocking portion 23 positioned at both sides of the mesa stripe portion 22 is formed of a p-type current blocking layer 29 of p-type InP (positioned at a lower side) and an n-type current blocking layer 30 of n-type InP (positioned at an upper side).

The tip portion 35 of the p-type current blocking layer 29 (positioned at the lower side) is positioned higher than the upper surface of the mesa stripe portion 22.

As the p-type impurity for the p-type current blocking layer 29, Zn or Cd is employed.

In the p-type current blocking layer 29, the impurity concentration thereof near the upper surface 28 of the n-type InP substrate 21 is higher than that in the proximity of the side surface 27 of the mesa stripe portion 22.

As the n-type impurity of the n-type current blocking layer 30 positioned at the upper side, Si is employed.

The concentration of the n-type impurity of the n-type current blocking layer 30 is $2 \times 10^{18}$ cm$^{-3}$.

A p-type third clad layer 31 of 2.5 μm thick containing $1.0 \times 10^{18}$ cm$^{-3}$ of a p-type impurity is formed so as to commonly cover the upper surface of the mesa stripe portion 22 and the upper surface of the current blocking portion 23.

On the third clad layer 31, a contact layer 32 of InGaAsP or InGaAs is formed.

On the upper surface of the contact layer 32, an electrode plate 33 is attached.

Furthermore, an electrode plate 34 is attached on the lower surface of the n-type InP substrate 21.

In the semiconductor laser thus constructed, the inclination angle of the side surface 27 of the mesa stripe portion 22 in contact with the current blocking portion 23 is set at 54.7° (θ)±1° to 5° (minor angle Δθ) where 54.7° is an angle at which the (111)B crystal plane is exposed.

Furthermore, in the upper surface 28 of the n-type InP substrate 21 in contact with the current blocking portion 23, a (100) crystal plane is exposed.

The tip portion 35 of the p-type current blocking layer 29 grown on the plane close to the (111)B crystal plane of the mesa stripe portion 22 and on the (100) crystal plane as the upper surface of the n-type InP substrate 21, is positioned higher than the upper surface of the mesa stripe portion 22.

Furthermore, in the p-type current block layer 29, the impurity concentration near the n-type InP substrate 21 is set to be higher than that near the side surface 27 of the mesa stripe portion 22.

It is therefore possible to further reduce the reactive current flowing from the second clad layer 26 of p-type InP through the p-type current blocking layer 27 (29) in the proximity of the side surface 27 of the mesa stripe portion 22.

Furthermore, it becomes difficult to turn on (become conductive) a thyristor of a p-n-p-n structure formed of the p-type third clad layer 31, n-type current blocking layer 30, p-type current blocking layer 29, and n-type InP semiconductor substrate 21. As a result, a higher voltage can be applied to the semiconductor laser, stabilizing the characteristics of the semiconductor laser.

The p-type current blocking layer 29 is formed almost uniformly over the side surface 27 of the mesa stripe portion 22 from the beginning of the growth.

Accordingly, the reactive current flowing from the p-type second clad layer to the n-type InP substrate 21 by way of the p-type current blocking layer 29 can be minimized to a constant value without fail.

Furthermore, it is possible to lower the specific resistance of the n-type InP substrate 21 compared to that of the p-type InP substrate.

Therefore, even if a large amount of current is supplied to the semiconductor laser, the amount of heat generation is low due to the use of the n-type InP substrate 21. Thus, the high-power laser light is obtained by increasing the amount of current.

In this way, it is possible to simultaneously improve the important characteristics contributing to high efficiency and high power of the semiconductor laser.

As a next step, the method of manufacturing the semiconductor laser shown in FIG. 1 will be explained with reference to FIGS. 4A–H.

Figure 4A:
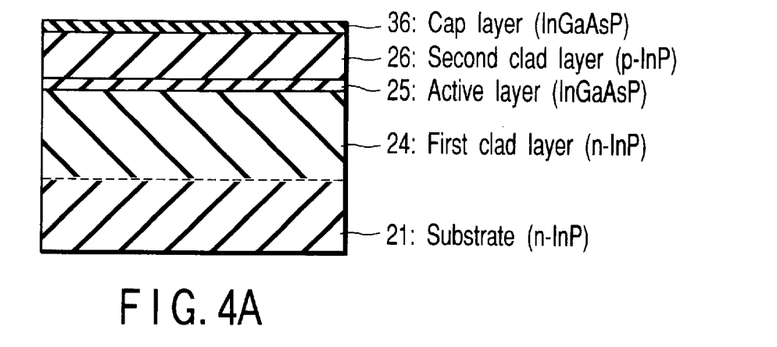
FIGS. 4A–H are manufacturing steps showing a method of manufacturing the semiconductor laser according to an embodiment of the present invention.

As shown in FIG. 4A, on the n-type InP substrate 21 formed of a semiconductive material, doped with an n-type impurity and having a (100) crystal plane as the upper surface, the n-type first clad layer 24 of 0.5 $\mu$m thick doped with an n-impurity of $1.0 \times 10^{18}$ cm$^{-3}$ is formed by a metal-organic-vapor-phase epitaxy (MOVPE) method.

On the upper surface of the n-type first clad layer 24, the active layer 25 of a multiple quantum well structure formed of a non-doped InGaAs, a non-doped InGaAsP, or a combination thereof is formed with a thickness of 0.2 $\mu$m.

On the active layer 25, the p-type second clad layer 26 doped with a p-type impurity of 5 to $7 \times 10^{17}$ cm$^{-3}$ is formed with a thickness of 0.45 $\mu$m.

On the p-type second clad layer 26, the p-type cap layer 36 of p-type InGaAsP doped with a p-type impurity of $5-7 \times 10^{17}$ cm$^{-3}$ is formed with a thickness of 0.15 $\mu$m.

Figure 4B:
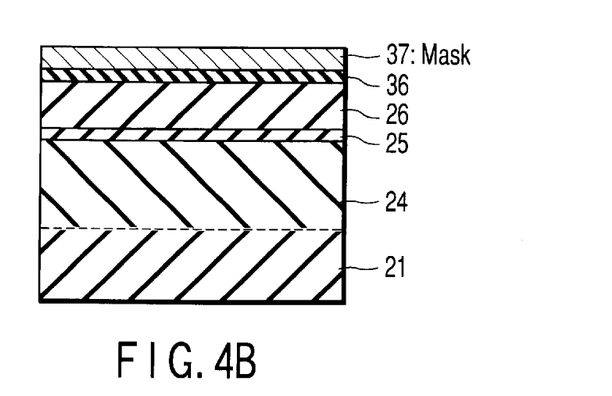

Subsequently as shown in FIG. 4B, on the cap layer 36, the mask 37 of SiNx is formed with a thickness of 80 nm by plasma CVD.

Figure 4C:
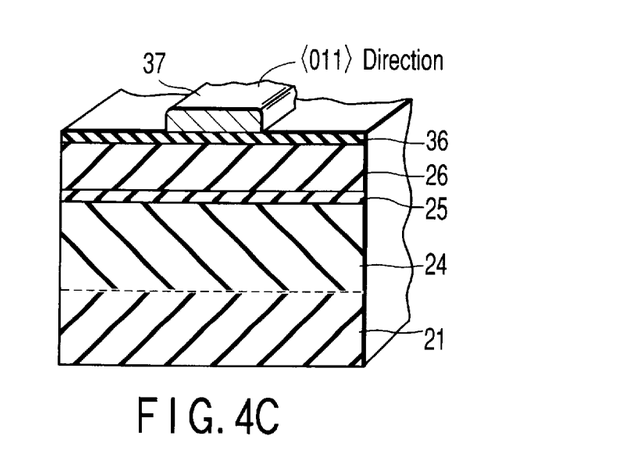

Further as shown in FIG. 4C, the mask 37 formed on the cap layer 36 is then etched into stripes in the direction of a <011> direction by use of a photolithographic technique.

The width of the stripe is set to be slightly wider than the width of the upper surface of the trapezoidal mesa stripe portion 22 to be formed.

Figure 4D:
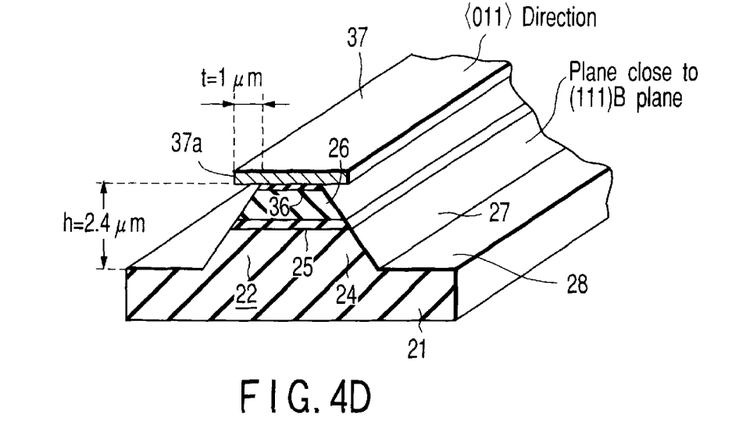

Subsequently, using a solution mixture of hydrochloric acid, hydrogen peroxide, and water as an etching solution, the portion of the resultant structure except the mask 37 is selectively etched in the <011> direction to obtain the trapezoidal mesa stripe portion 22 of 2.4 $\mu$m height, as shown in FIG. 4D.

In this case, the etching rate of the cap layer 36 is faster than other portion(s), so that the etching speed for the portions under the cap layer increases.

Therefore, if the side-etching amount of the cap layer 36 is controlled, it is possible to form the side surface 27 of the mesa stripe portion 22 inclined at a desired inclination angle.

More specifically, if the cap layer 36 and setting the etching conditions are set as mentioned above, the inclination angle of the side surface 27 of the mesa stripe portion 22 can be set at 54.7° ($\theta$)±1 to 5° (minor angle $\Delta\theta$) where 54.7° is an angle at which the (111)B crystal plane is exposed.

Furthermore, due to the formation of the cap layer 36, eaves 37a having a width of t=1 $\mu$m can be formed at both ends of the mask 37.

Note that the eaves 37a has a function of preventing the tip portion 35 of the p-type current blocking layer 29 from significantly protruding from the top end of the mesa stripe portion 22.

Figures 4E, 4G:
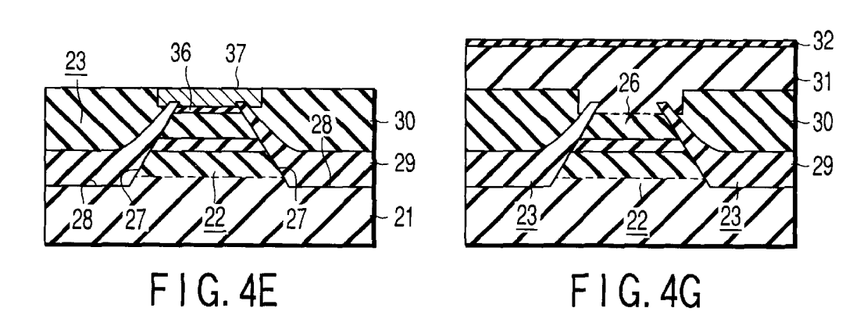

Next, as shown in FIG. 4E, in the portion surrounded by the side surface 27 of the mesa stripe portion 22 and the upper surface 28 of the n-type InP substrate 12, which has previously been etched away, the p-type current blocking layer 29 containing an impurity (Zn) in a concentration of $1 \times 10^{18}$ cm$^{-3}$ is formed with a thickness of 0.7 $\mu$m by the aforementioned metal-organic-vapor-phase epitaxy (MOVPE) method.

Further on the p-type current blocking layer 29, the n-type current blocking layer 30 containing an impurity (Si) in a concentration of $2 \times 10^{18}$ cm$^{-3}$ is formed with a thickness of 1.15 $\mu$m by the aforementioned metal organic vapor phase epitaxy (MOVPE) method.

Now, the current blocking portion 23 is formed of the p-type current blocking layer 29 and the n-type current blocking layer 30.

Figure 4F:
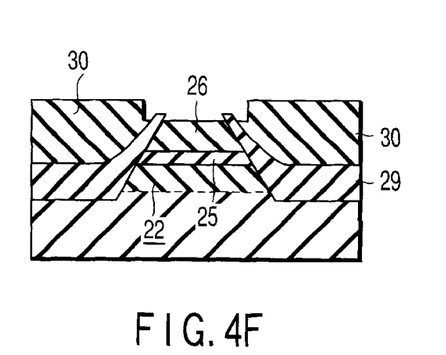

Next, as shown in FIG. 4F, the cap layer 36 and the mask 37 on the p-type second clad layer 26 of the mesa stripe portion 22 are removed with a solvent to expose the upper surface of the p-type second clad layer 26.

Subsequently as shown in FIG. 4G, on the upper surface of the mesa stripe portion 22 and the upper surface of the current blocking portion 23, the p-type third clad layer 31 containing a p-type impurity in a concentration of $1 \times 10^{18}$ cm$^{-3}$ is formed with a thickness of 2.5 $\mu$m so as to simultaneously cover them.

On the third clad layer 31, a contact layer 32 of InGaAsP or InGaAs is formed.

Figure 4H:
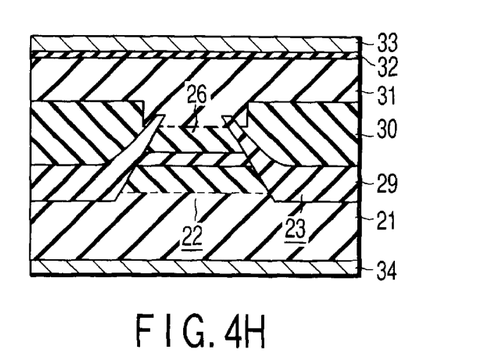

Finally, as shown in FIG. 4H, the electrode plate 33 is attached to the upper surface of the contact layer 32.

Furthermore, the electrode plate 34 is attached on the lower surface of the n-type InP substrate 21.

According to the method of manufacturing a semiconductor laser, the cap layer 36 is formed between the p-type second clad layer 26 and the mask 37 of the mesa stripe portion 22 and etching is performed under the aforementioned conditions. By virtue of this, the side surface 27 of the mesa stripe portion 22 is formed so as to have a crystal plane close to the (111)B crystal plane but not equal to the (111)B crystal plane itself.

Therefore, it is possible to form the p-type current blocking layer 29 having the aforementioned two excellent characteristics on the side surface 27 of the mesa stripe portion 22 and on the upper surface 28 of the n-type InP substrate 21.

As explained above, in the semiconductor laser and the method of manufacturing a semiconductor laser of the present invention, the side surface of the mesa stripe portion having a trapezoidal shape is set so as to have a crystal plane which is close to the (111) crystal plane but not equal to the (111) crystal plane itself.

Therefore, the thickness of the p-type current blocking layer in contact with the side surface of the mesa stripe can be controlled to be constant and thin. Furthermore, the impurity concentration of the p-type current blocking layer near the active layer of the mesa stripe portion can be set to be lower than that near the (100) crystal plane of the n-type semiconductor substrate.

As a result, the reactive current flowing the p-type current blocking layer can be controlled within a certain value and a high withstand voltage can be maintained in the current blocking portion. Thus, high-power laser light can be stably emitted with high efficiency.

Furthermore, since the n-type InP substrate is used, the specific resistance can be reduced.

Even if a large amount of current is supplied to the semiconductor laser, the amount of heat generation is low. Therefore, the high-power laser light can be readily obtained simply by increasing the current.

According to the present invention, the n-type semiconductor substrate is used. In addition, the inclination angle of the side surface of the mesa stripe portion is set so as not to directly expose the (111)B crystal plane. Therefore, the reactive current not flowing through the active layer of the mesa stripe portion can be controlled within a predetermined level. Furthermore, high withstand voltage of the current blocking portion can be maintained. Hence, it is possible to provide a semiconductor laser and a method of manufacturing the semiconductor laser capable of providing stable, high efficiency and high power light-emission characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser comprising:
   an n-type semiconductor substrate having a (100) crystal plane as an upper surface;
   a mesa stripe portion having a trapezoidal shape and formed along a <011> direction, said mesa stripe portion including an n-type first clad layer, an active layer, and a p-type second clad layer, which are successively formed on the n-type semiconductor substrate;
   a current blocking portion comprising a p-type current blocking layer formed outside the mesa stripe portion and on the n-type semiconductor substrate, and an n-type current blocking layer formed on the p-type current blocking layer; and
   a p-type third clad layer simultaneously covering both an upper surface of the mesa stripe portion and an upper surface of the current blocking portion,
   wherein an inclination of a side surface of the mesa stripe portion is set at an angle within +1° to +5 or −1 to −5° of an inclination angle of a (111)B crystal plane, such that when the inclination angle of the (111)B plane is approximately 55° the inclination of the side surface of the mesa stripe is approximately 56° to 60° or 50° to 54°.

2. The semiconductor laser according to claim 1, wherein:
   a thickness of said p-type current blocking layer in a direction perpendicular to the side surface of the mesa stripe portion near the active layer is set to be thinner than a thickness in a direction perpendicular to the (100) crystal plane of the n-type semiconductor substrate; and
   an impurity concentration of said p-type current blocking layer near the active layer of the mesa stripe portion is set to be lower than an impurity concentration of said p-type current blocking layer near the (100) crystal plane of the n-type semiconductor substrate.

3. The semiconductor laser according to claim 2, wherein:
   said n-type semiconductor substrate is formed of n-type InP; and
   said p-type current blocking layer is formed of p-type TnP containing an impurity of Zn or Cd.

4. The semiconductor laser according to claim 1, wherein an upper end of the side surface of the mesa stripe portion is positioned higher than the active layer.

5. A method of manufacturing a semiconductor laser comprising:
   preparing an n-type semiconductor substrate having a (100) crystal plane as an upper surface;
   stacking an n-type first clad layer, an active layer, and a p-type second clad layer sequentially on the n-type semiconductor substrate, and forming a mesa stripe portion having a trapezoidal shape along a <011> direction, said mesa stripe portion including the n-type first clad layer, the active layer, and the p-type second clad layer;
   forming a p-type current blocking layer outside the mesa stripe portion and on the n-type semiconductor substrate, and an n-type current blocking layer on the p-type current blocking layer, to thereby form a current blocking portion using a metal organic vapor phase epitaxy (MOVPE) method; and
   covering both an upper surface of the mesa stripe portion and an upper surface of the current blocking portion with a p-type third clad layer,
   wherein an inclination of a side surface of the mesa stripe portion is set at an angle within +1° to +5° or −1° to −5° of an inclination angle of a (111)B crystal plane, such that when the inclination angle of the (111)B plane is approximately 55°, the inclination of the side surface of the mesa stripe is approximately 56° to 60° or 50° to 54°.

6. The method according to claim 5, wherein:
   said mesa stripe portion is formed by forming a mask on an upper surface of the second clad layer and etching the n-type first clad layer, the active layer, and the p-type second clad layer into a trapezoidal shape;

said current blocking portion is formed by growing the p-type current blocking layer and the n-type current blocking layer on the side surface of the mesa stripe portion and on the upper surface of the n-type semiconductor substrate exposed by etching;

said p-type third clad layer is formed so as to simultaneously cover both the upper surface of the mesa stripe portion from which the mask is removed and the upper surface of the current blocking portion; and forming the mesa stripe portion comprises
interposing a cap layer between the second clad layer and the mask;
setting etching conditions such that the inclination of the side surface of the mesa stripe portion to be obtained by side etching of the cap layer has an angle near a predetermined angle at which the (111)B crystal plane is exposed, excluding the predetermined angle; and
removing the mask simultaneously with the cap layer.

7. The method according to claim 5, wherein:
said n-type semiconductor substrate is InP doped with an n-type impurity,
said first clad layer is InP doped with an n-type impurity,
said active layer has a multiple quantum well structure consisting of non-doped TnGaAs, non-doped TnGaAsP, or a combination thereof,
said second clad layer is InP doped with a p-type impurity,
said cap layer is InGaAsP, and
the p-type current blocking layer is p-type TnP doped with an impurity of Zn or Cd.

* * * * *